(12) United States Patent
Yoshida (10) Patent No.: US 9,256,231 B2
(45) Date of Patent: Feb. 9, 2016

(54) DEVICE MANUFACTURING APPARATUS AND DEVICE MANUFACTURING METHOD

(75) Inventor: Tomohiko Yoshida, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 383 days.

(21) Appl. No.: 12/876,038

(22) Filed: Sep. 3, 2010

(65) Prior Publication Data
US 2011/0059621 A1 Mar. 10, 2011

(30) Foreign Application Priority Data

Sep. 10, 2009 (JP) ................................. 2009-209810

(51) Int. Cl.
*G05D 23/00* (2006.01)
*G05D 23/19* (2006.01)
*H01L 21/67* (2006.01)

(52) U.S. Cl.
CPC ...... *G05D 23/1928* (2013.01); *H01L 21/67248* (2013.01)

(58) Field of Classification Search
CPC ..................... G05D 23/1928; H01L 21/67242; H01L 21/67248
USPC .................. 165/287; 438/780, 781; 118/50.1; 700/121
See application file for complete search history.

(56) References Cited

U.S. PATENT DOCUMENTS

| 5,457,516 | A | * | 10/1995 | Kim | 399/37 |
|---|---|---|---|---|---|
| 5,631,852 | A | * | 5/1997 | Chen | 702/130 |
| 5,724,825 | A | * | 3/1998 | Lee et al. | 62/185 |
| 5,809,369 | A | * | 9/1998 | Furuya et al. | 399/70 |
| 6,483,068 | B2 | * | 11/2002 | Jang | 219/390 |
| 6,495,979 | B2 | * | 12/2002 | Park et al. | 315/406 |
| 6,567,080 | B1 | * | 5/2003 | Otsuka | 345/211 |
| 6,684,652 | B2 | * | 2/2004 | Kim et al. | 62/185 |
| 6,986,261 | B2 | * | 1/2006 | Sasaki et al. | 62/201 |
| 7,681,055 | B2 | * | 3/2010 | Iijima | 713/320 |
| 7,988,062 | B2 | * | 8/2011 | Nonaka et al. | 236/1 C |
| 8,010,237 | B2 | * | 8/2011 | Cheung et al. | 700/278 |
| 2007/0147868 | A1 | * | 6/2007 | Miyashita | 399/75 |
| 2007/0213864 | A1 | * | 9/2007 | Iijima | 700/121 |
| 2008/0297837 | A1 | * | 12/2008 | Soda | 358/1.15 |
| 2010/0111648 | A1 | * | 5/2010 | Tamura et al. | 414/217 |
| 2011/0059621 | A1 | * | 3/2011 | Yoshida | 438/795 |
| 2011/0083837 | A1 | * | 4/2011 | Sasaki et al. | 165/287 |
| 2011/0117492 | A1 | * | 5/2011 | Yamada et al. | 430/270.1 |
| 2012/0275812 | A1 | * | 11/2012 | Takiguchi | 399/88 |

FOREIGN PATENT DOCUMENTS

| JP | 11-249747 A | 9/1999 |
|---|---|---|
| JP | 2000-100717 A | 4/2000 |
| JP | 2003-133211 A | 5/2003 |
| JP | 2007-242854 A | 9/2007 |
| JP | 2008-300770 A | 12/2008 |

* cited by examiner

*Primary Examiner* — Mary Wilczewski
(74) *Attorney, Agent, or Firm* — Canon USA, Inc., IP Division (57) ABSTRACT

An apparatus for manufacturing a device comprises a temperature regulator configured to regulate a temperature of a component associated with manufacture of the device, a controller configured to control the temperature regulator, and a console configured to send command information to the controller upon receiving an input regarding an operation of the temperature regulator, the command information including a command for causing the temperature regulator to operate in an electric power saving mode, and a parameter which specifies a detail of the electric power saving mode.

8 Claims, 8 Drawing Sheets

※ WHEN CHECK BOX IS CHECKED, ELECTRIC POWER SAVING MODE IS VALID.

- ☑ ELECTRIC POWER SAVING MODE SETTING 1
  - ☑ DEVICE MANUFACTURING APPARATUS MAIN BODY
    - ☑ DRIVER
    - ☑ LASER INTERFEROMETER
    - ☑ ALIGNMENT SYSTEM
  - ☐ TEMPERATURE REGULATOR
    - ☐ PO TEMPERATURE REGULATION SYSTEM
    - ☑ WS TEMPERATURE REGULATION SYSTEM
    - ☑ RS TEMPERATURE REGULATION SYSTEM
    - ☑ BOOTH AIR CONDITIONING SYSTEM
  - ☑ EXCIMER LASER
  - ☑ CONVEYANCE SYSTEM
- ☑ ELECTRIC POWER SAVING MODE SETTING 2
  - ☑ DEVICE MANUFACTURING APPARATUS MAIN BODY
    - ☑ DRIVER
    - ☑ LASER INTERFEROMETER
    - ☑ ALIGNMENT SYSTEM
  - ☐ TEMPERATURE REGULATOR
    - ☐ PO TEMPERATURE REGULATION SYSTEM
    - ☐ WS TEMPERATURE REGULATION SYSTEM
    - ☐ RS TEMPERATURE REGULATION SYSTEM
    - ☐ BOOTH AIR CONDITIONING SYSTEM
  - ☑ EXCIMER LASER
  - ☑ CONVEYANCE SYSTEM
- ☑ ELECTRIC POWER SAVING MODE SETTING 3
  - ☐ DEVICE MANUFACTURING APPARATUS MAIN BODY
    - ☑ DRIVER
    - ☐ LASER INTERFEROMETER
    - ☑ ALIGNMENT SYSTEM
  - ☐ TEMPERATURE REGULATOR
    - ☐ PO TEMPERATURE REGULATION SYSTEM
    - ☐ WS TEMPERATURE REGULATION SYSTEM
    - ☐ RS TEMPERATURE REGULATION SYSTEM
    - ☐ BOOTH AIR CONDITIONING SYSTEM
  - ☑ EXCIMER LASER
  - ☑ CONVEYANCE SYSTEM
- ⊞ ELECTRIC POWER SAVING MODE SETTING 4
- ⊞ ELECTRIC POWER SAVING MODE SETTING 5

F I G. 4

■ TEMPERATURE REGULATOR
　DETAILED SETTING OF WS TEMPERATURE REGULATION SYSTEM
　　TEMPERATURE REGULATION SYSTEM NAME
　　WS TEMPERATURE REGULATION SYSTEM 1
　　　SELECT ELECTRIC POWER SAVING MODE
　　　　☐ INVALID
　　　　☐ TEMPERATURE CONTROL OFF
　　　　☑ CHANGE TARGET TEMPERATURE

| ITEM | DEFAULT VALUE | SET VALUE |
|---|---|---|
| TARGET TEMPERATURE | 22.600 | 23.000 |
| PROPORTIONAL GAIN P | 1.3 | 1.8 |
| INTEGRAL GAIN I | 40.0 | 40.0 |
| DERIVATIVE GAIN D | 10.0 | 10.0 |
| THRESHOLD | 0.300 | 0.500 |

WS TEMPERATURE REGULATION SYSTEM 2
　　　SELECT ELECTRIC POWER SAVING MODE
　　　　☑ INVALID
　　　　☐ TEMPERATURE CONTROL OFF
　　　　☐ CHANGE TARGET TEMPERATURE

| ITEM | DEFAULT VALUE | SET VALUE |
|---|---|---|
| TARGET TEMPERATURE | 23.000 | 23.000 |
| PROPORTIONAL GAIN P | 2.5 | 2.5 |
| INTEGRAL GAIN I | 30.0 | 30.0 |
| DERIVATIVE GAIN D | 7.5 | 7.5 |
| THRESHOLD | 0.300 | 0.300 |

FIG. 7A
AMOUNT OF HEAT GENERATED BY DRIVING SYSTEM

FIG. 7B
WAFER STAGE TEMPERATURE

DEVICE MANUFACTURING APPARATUS AND DEVICE MANUFACTURING METHOD

BACKGROUND OF THE INVENTION

1. Field of the Invention

The present invention relates to a device manufacturing apparatus and device manufacturing method for manufacturing a device.

2. Description of the Related Art

A semiconductor device manufacturing process uses an exposure apparatus to reduce a pattern formed on a mask and project it onto a substrate coated with a photoresist. Higher integration densities of semiconductor devices require further micropatterning. Along with the development of the resist process, exposure apparatuses are coping with micropatterning.

Heat generated by a device manufacturing apparatus such as an exposure apparatus increases as the throughput of the device manufacturing apparatus increases. A stage driving mechanism having a linear motor is cooled using a coolant or cooling medium (cooling liquid) such as water, antifreeze, or inert liquid. The coolant or cooling medium may comprise gas. The cooling medium whose temperature rises upon absorbing heat undergoes primary temperature regulation by a cooler using inverter control or hot gas bypass control, or heat exchange with cooling water supplied from facilities. It is difficult for only primary temperature regulation using the cooler or heat exchange to achieve the kind of high-precision temperature regulation demanded by the device manufacturing apparatus. Thus, secondary temperature regulation using a high-precision heater with a good response characteristic is executed near a heat generating portion.

Japanese Patent Laid-Open No. 2003-133211 discloses a technique of satisfactorily cooling air by a cooler, then heating it by a low-sensitivity base heater, and further heating it by a high-sensitivity heater.

When the productivity of the device manufacturing apparatus is low, the amount of heat generated is small. In this case, electric power is wastefully consumed if cooling by the primary temperature regulator and rewarming by the secondary temperature regulator are performed for a target temperature determined in consideration of the maximum amount of generated heat.

SUMMARY OF THE INVENTION

The present invention provides, for example, a device manufacturing apparatus advantageous in electric power consumption.

One of aspects of the present invention provides an apparatus for manufacturing a device, comprising a temperature regulator configured to regulate a temperature of a component associated with manufacture of the device, a controller configured to control the temperature regulator, and a console configured to send command information to the controller upon receiving an input regarding an operation of the temperature regulator, the command information including a command for causing the temperature regulator to operate in an electric power saving mode, and a parameter which specifies a detail of the electric power saving mode.

Further features of the present invention will become apparent from the following description of exemplary embodiments with reference to the attached drawings.

DESCRIPTION OF THE EMBODIMENTS

Figure 1:
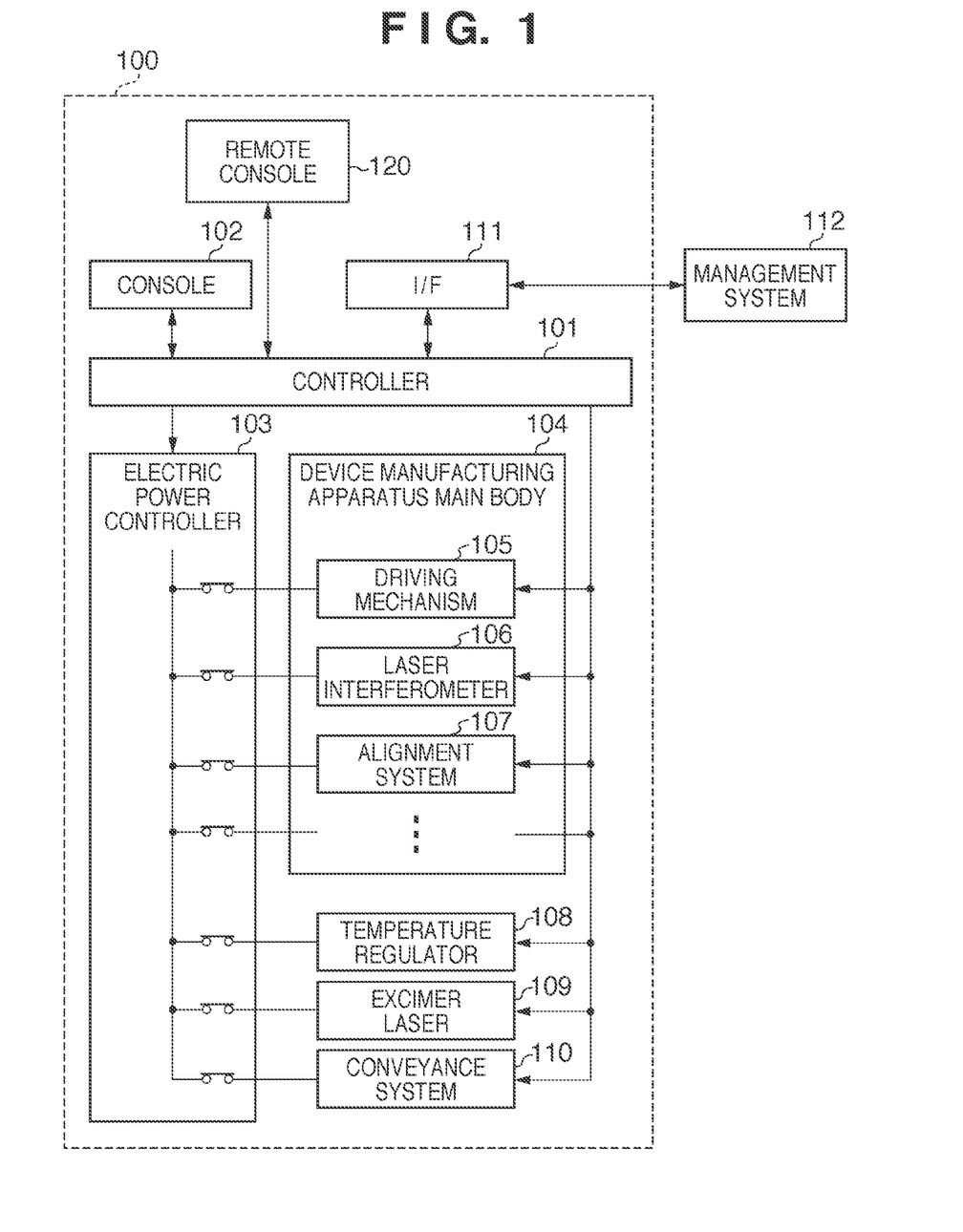
FIG. 1 is a block diagram showing the arrangement of a device manufacturing apparatus according to an embodiment of the present invention.

A device manufacturing apparatus 100 according to an embodiment of the present invention will be described with reference to FIG. 1. The device manufacturing apparatus 100 shown in FIG. 1 is configured as an exposure apparatus which projects a reticle pattern onto a wafer (substrate) via a projection optical system, exposing the substrate to radiant energy. However, the device manufacturing apparatus of the present invention is applicable to various kinds of apparatuses such as a deposition apparatus (e.g., CVD apparatus), developing apparatus, and coating apparatus. The term "device" can include, for example, a semiconductor device, liquid crystal device, and MEMS.

The device manufacturing apparatus 100 includes a temperature regulator 108 which regulates the temperature of a component associated with the manufacture of a device, a controller 101, and a console 102 and/or 120. The console 120 can be configured as, for example, a remote console. The device manufacturing apparatus 100 can further include an electric power controller 103, device manufacturing apparatus main body 104, interface (I/F) 111, excimer laser (light source) 109, and conveyance system 110. The controller 101 is an example of a controller which controls the temperature regulator 108. In this embodiment, the controller 101 can control the electric power controller 103, main body 104, interface (I/F) 111, excimer laser (light source) 109, and conveyance system 110, in addition to the temperature regulator 108.

The main body 104 can include, for example, a driving mechanism 105 for a reticle stage and wafer stage, a laser interferometer 106, and an alignment system 107. The driving mechanism 105, laser interferometer 106, alignment system 107, excimer laser 109, and conveyance system 110 are examples of components associated with the manufacture of a device.

The console 102 and/or 120 can be configured to function as a user interface, receive an input regarding the operation of the device manufacturing apparatus 100 from the user, and send command information to the controller 101. The command information can include, for example, a command to operate the temperature regulator 108 in the electric power saving mode, and parameters which specify details of the electric power saving mode. The console 120 configured as a remote console can be used to manipulate the device manufacturing apparatus 100 from a remote place. The interface 111 can be used to connect a management system 112 which manages the operations of a plurality of device manufacturing apparatuses.

The operation mode of the device manufacturing apparatus 100 can include one non-electric power saving mode and at least one electric power saving mode. An operation mode change command can be given to the controller 101 via, for example, the consoles 102 and 120 and the interface 111.

In the electric power saving mode, supply of electric power to at least one of components (e.g., 105 to 110) which receive electric power from the electric power controller 103 can be stopped. Alternatively, supplied electric power can be decreased from that in the non-electric power saving mode. In the electric power saving mode, the controller 101 can shift at least one of the components (e.g., 105 to 110) to an idle state.

The temperature regulator 108 can include, for example, a PO temperature regulation system which regulates the temperature of a projection optical system, a WS temperature regulation system which regulates the temperature of a wafer stage, an RS temperature regulation system which regulates the temperature of a reticle stage, and a booth air conditioning system which regulates the temperature of the atmosphere in the booth. In the electric power saving mode, the electric power controller 103 can (continuously or intermittently) stop at least one of the PO temperature regulation system, WS temperature regulation system, RS temperature regulation system, and booth air conditioning system of the temperature regulator 108 under the control of the controller 101. Alternatively, in the electric power saving mode, the controller 101 sets (changes) the parameters of a target system so as to reduce electric power consumption in at least one of the PO temperature regulation system, WS temperature regulation system, RS temperature regulation system, and booth air conditioning system of the temperature regulator 108. Resetting of parameters can include setting the target temperature of the primary temperature regulator to be higher than that in the non-electric power saving mode in a system having the primary temperature regulator which cools a cooling medium (liquid or gas), and the secondary temperature regulator which heats the cooling medium having passed through the primary temperature regulator.

Figure 2:
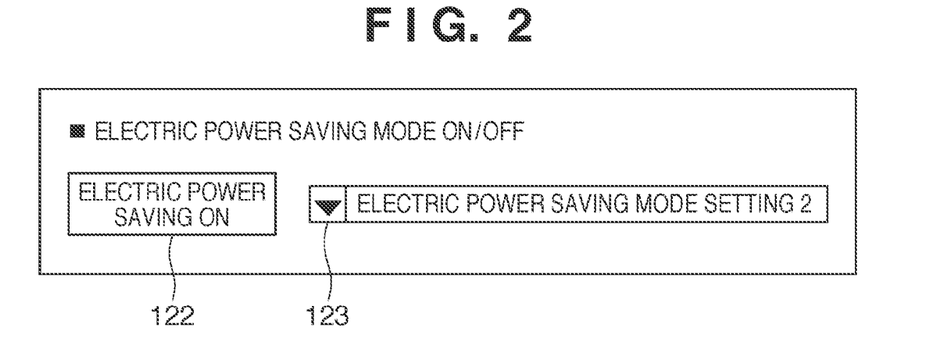
FIG. 2 is a view exemplifying a GUI which can be provided on the display of the console of the device manufacturing apparatus according to the embodiment of the present invention.

FIG. 2 exemplifies a GUI (Graphical User Interface) which can be provided on the display of the console 102 and/or 120. The GUI can include, for example, a switch 122 for setting the electric power saving mode ON (start) or OFF (stop). The GUI can also include a selection window 123 for allowing the user to select an arbitrary one of electric power saving modes from a pull-down menu. It is also possible to set a protection function using a password in order to prevent erroneously shifting to the electric power saving mode, or to prepare a macro as a set of commands. Instead of the GUI, a physical switch may be arranged.

Figure 3:
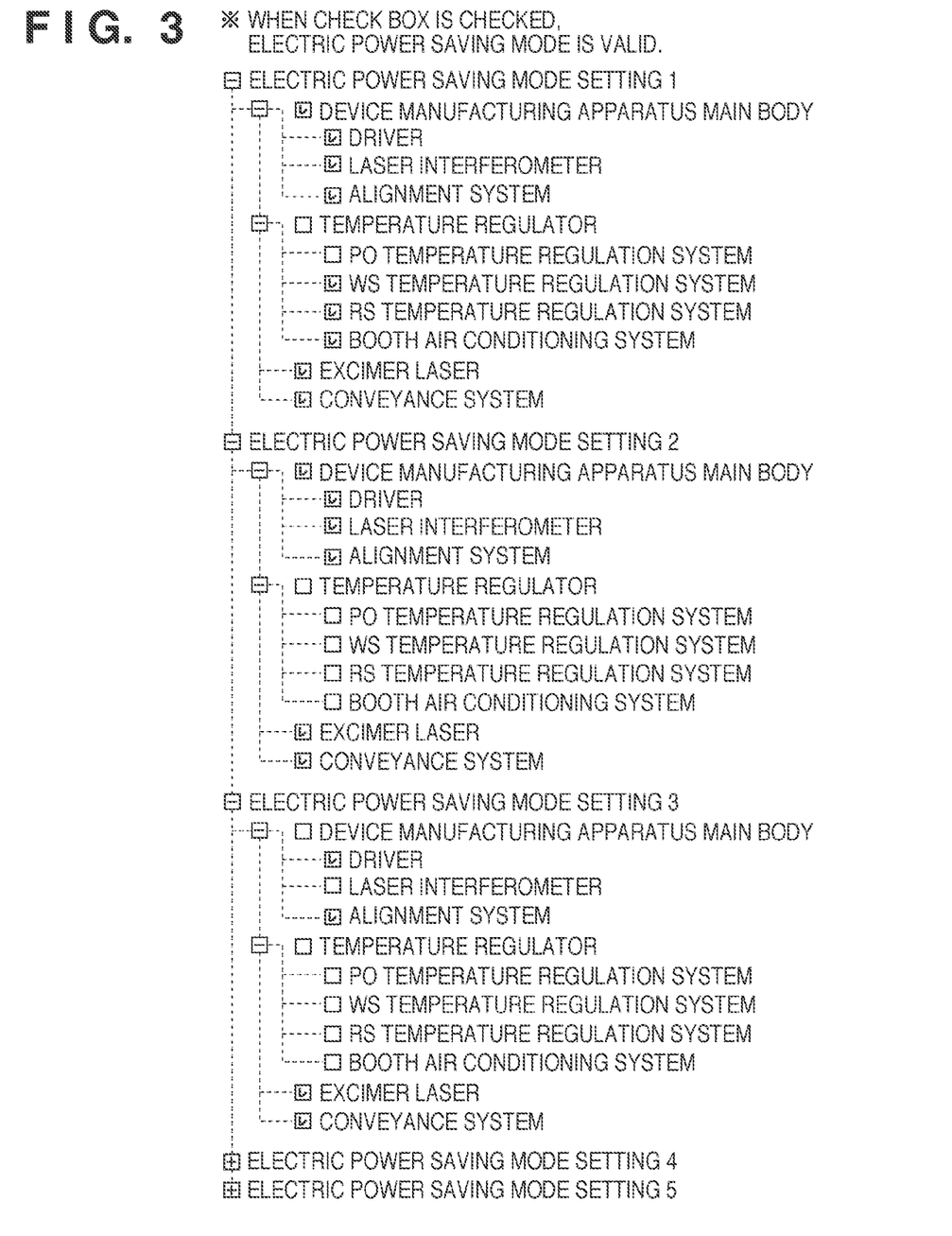
FIG. 3 is a view exemplifying the GUI which can be provided on the display of the console of the device manufacturing apparatus according to the embodiment of the present invention.

FIG. 3 exemplifies an electric power saving mode setting method using the GUI which can be provided on the display of the console 102 and/or 120. As exemplified in FIG. 3, the setting items of the electric power saving mode have a tree structure. The user can set a component which is to shift to an electric power saving state in the electric power saving mode depending on whether the check box is checked.

Figure 4:
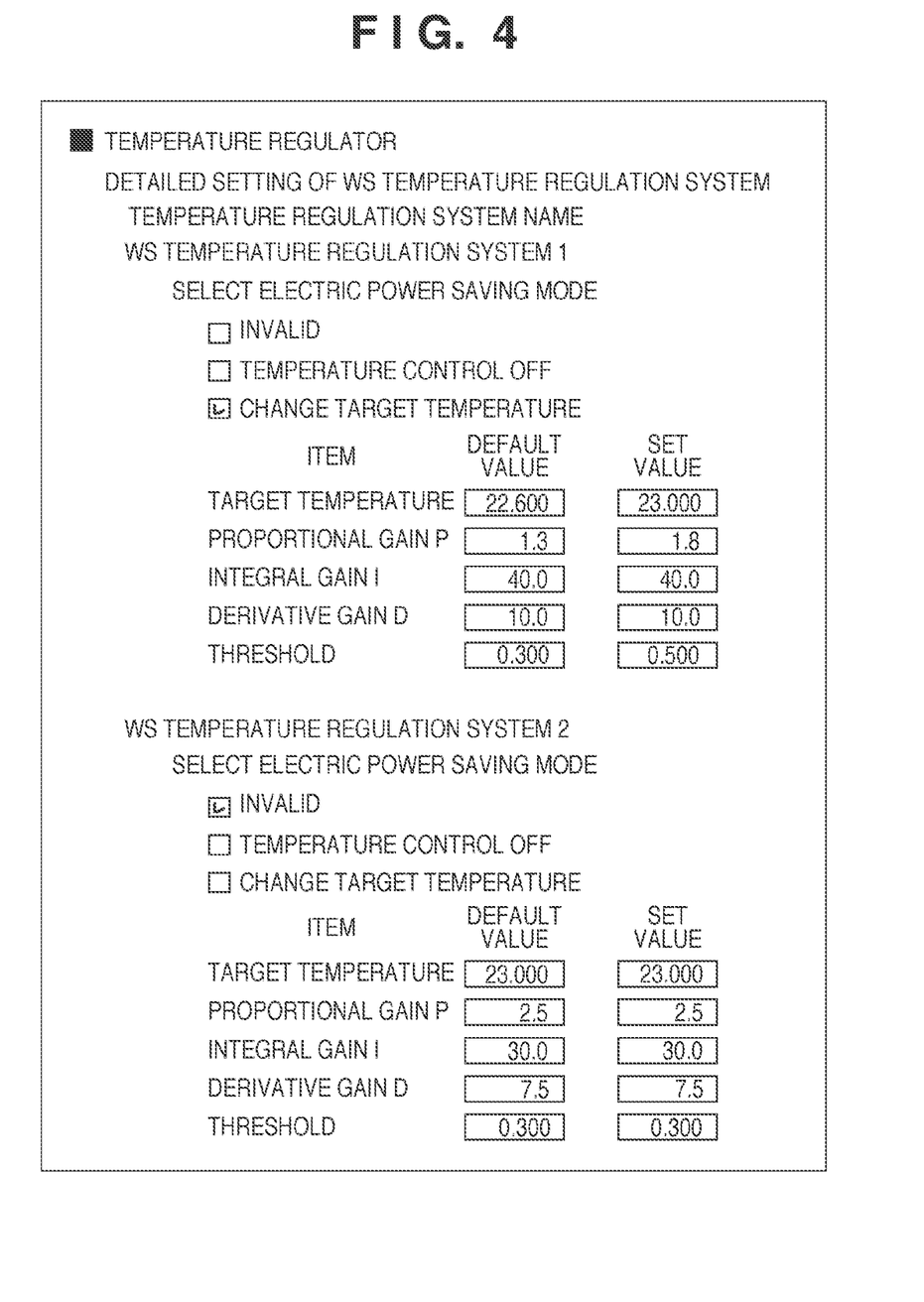
FIG. 4 is a view exemplifying the GUI which can be provided on the display of the console of the device manufacturing apparatus according to the embodiment of the present invention.

FIG. 4 exemplifies the parameter setting method of the temperature regulator 108 using the GUI which can be provided on the display of the console 102 and/or 120. Parameters can be set individually for a plurality of systems. In the example shown in FIG. 4, parameters include high-order parameters "invalid", "temperature control OFF", and "change target temperature". When "invalid" is set, the state remains unchanged even upon a shift to the electric power saving mode. When "temperature control OFF" is set, temperature control of a corresponding system stops upon a shift to the electric power saving mode. When "change target temperature" is set, the target temperature is changed upon a shift to the electric power saving mode. In the example shown in FIG. 4, lower-order parameters such as the proportional gain P, integral gain I, and derivative gain D of a compensator, and a threshold can also be set in addition to the target temperature. A "default value" is a parameter used in the non-electric power saving mode, and a set value is a parameter used in the electric power saving mode. A parameter indicating the target temperature of temperature regulation by the primary temperature regulator in the electric power saving mode indicates a target temperature which is closer to the target temperature of temperature regulation by the secondary temperature regulator than that of temperature regulation by the primary temperature regulator in the non-electric power saving mode.

Figure 5:
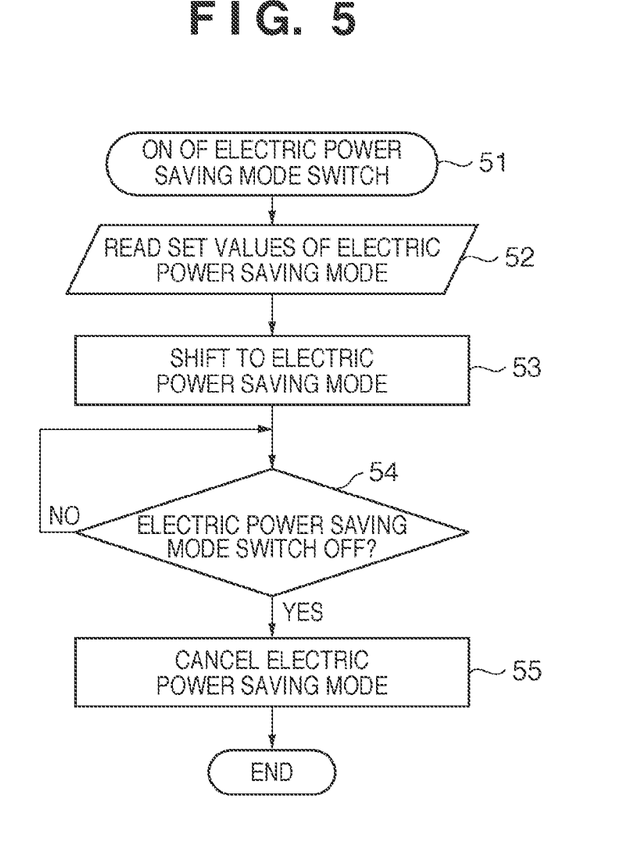
FIG. 5 is a flowchart associated with the electric power saving mode of the device manufacturing apparatus according to the embodiment of the present invention.

FIG. 5 is a flowchart associated with the electric power saving mode of the device manufacturing apparatus according to the embodiment of the present invention. The controller 101 controls processes shown in the flowchart. When the user turns on the electric power saving mode switch on the GUI of the console 102 and/or 120 in step 51, the controller 101 reads parameters exemplified in FIGS. 2 to 4 in step 52. In step 53, the controller 101 shifts the device manufacturing apparatus 100 to the electric power saving mode by controlling the components in accordance with the parameters. This includes a shift of the temperature regulator 108 to the electric power saving mode. If the user turns off the electric power saving mode switch in step 54, the controller 101 cancels the electric power saving mode and shifts the device manufacturing apparatus 100 to an operation in a steady state (non-electric power saving mode) in step 55. When the device manufacturing apparatus 100 is in a state not suited to a shift to the electric power saving mode, for example, it is executing a job upon turning on the electric power saving mode switch, the controller 101 shifts the device manufacturing apparatus 100 to the electric power saving mode after the device manufacturing apparatus 100 changes to a state suited to a shift to the electric power saving mode.

The console 102 and/or 120 may be configured to receive an operation command to shift the device manufacturing apparatus to the electric power saving mode in a specific period such as the nighttime. When the console 102 and/or 120 receives this operation command, the controller 101 can shift the device manufacturing apparatus to the electric power saving mode during a specific period by using a timer function (not shown).

Figure 6:
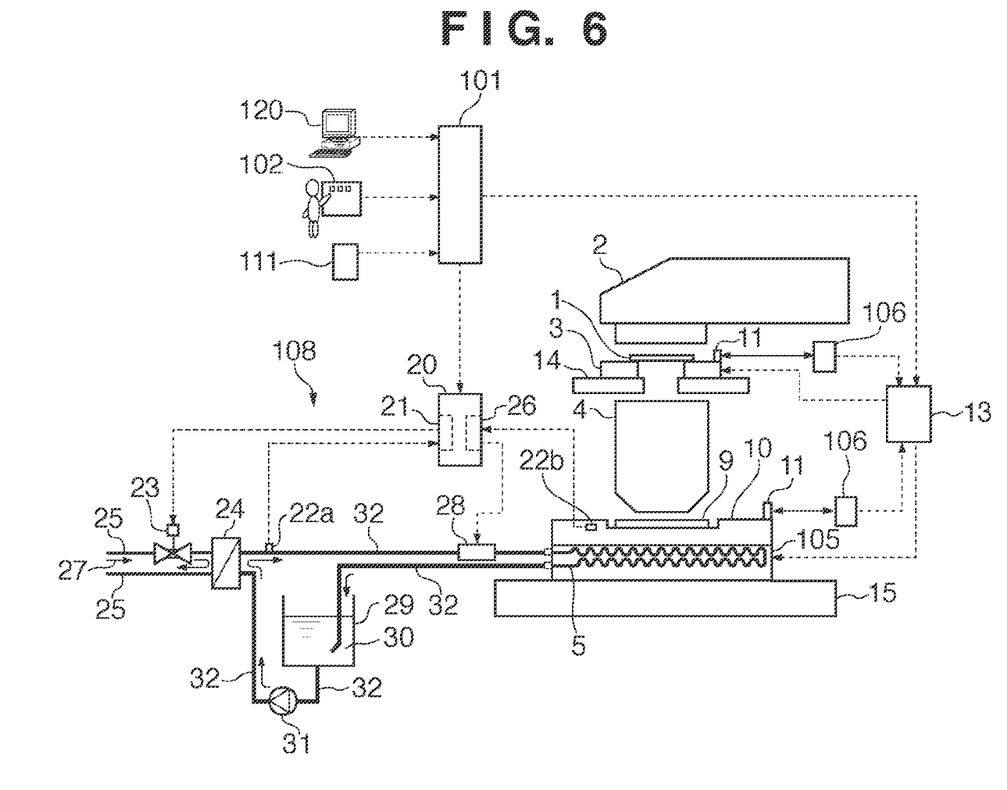
FIG. 6 is a view showing the arrangement of the device manufacturing apparatus according to the embodiment of the present invention.

The device manufacturing apparatus 100 according to the embodiment of the present invention will be described from another aspect with reference to FIG. 6. In the example shown in FIG. 6, the device manufacturing apparatus 100 is configured as a scanner (scanning exposure apparatus). Light emitted by the excimer laser (light source) 109 (not shown in FIG. 6) enters an illumination optical system 2. The illumination optical system 2 illuminates part of a reticle (original) 1 with slit light (light whose sectional shape is defined by a slit) using the light received from the excimer laser 109. While illuminating the reticle 1 with the slit light, a reticle stage 3 which holds the reticle 1, and a wafer stage 10 which holds a wafer (substrate) 9 are scanned synchronously. By the synchronous scanning, the entire pattern on the reticle 1 is transferred to the wafer 9 via a projection optical system 4.

A base plate 14 supports the reticle stage 3, and a base plate 15 supports the wafer stage 10. The two-dimensional positions of the reticle stage 3 and wafer stage 10 are measured in real time by a measurement device including a reference mirror 11 and the laser interferometer 106. Based on the measurement values, a stage controller 13 (not shown in FIG. 1 for descriptive convenience) performs positioning and synchronous control of the reticle 1 (reticle stage 3) and wafer 9 (wafer stage 10). The wafer stage 10 is driven by the driving mechanism 105, thereby controlling the up-and-down (vertical) position, rotational direction, and tilt of the wafer 9. In exposure, the driving mechanism 105 can control the wafer stage 10 so that the surface of the wafer 9 is adjusted to the focal plane of the projection optical system 4. An optical focus sensor (not shown) can measure the surface position (up-and-down position and tilt) of the wafer 9, and provides the result to the stage controller 13.

The main body 104 of the device manufacturing apparatus 100 is mounted in an environment chamber (not shown), and an environment surrounding the main body 104 can be maintained at a predetermined temperature. Gas whose temperature is individually controlled is blown into a space surrounding the reticle stage 3, wafer stage 10, laser interferometer 106, and the like, and one surrounding the projection optical system 4. As a result, the environmental temperature can be maintained with higher precision.

Particularly, the driving mechanism 105 which drives the wafer stage 10 and reticle stage 3 generates a large amount of heat. The driving mechanism 105 is driven in accordance with a command from the stage controller 13, and the amount of heat generated by the driving mechanism 105 can depend on the driving pattern. Heat generated by the driving mechanism 105 is a cause of expansion and distortion of the wafer stage 10 (wafer 9) and reticle stage 3 (reticle 1). The expansion and distortion of the wafer stage 10 and reticle stage 3 lead to positional variations and tilt of the reference mirror 11, causing an error in the result of measurement by the measurement device including the laser interferometer 106. The expansion and distortion of the wafer 9 and reticle 1 may cause a distortion such as reduction or enlargement of a pattern formed by exposure. If the surface temperature of the wafer stage 10 or reticle stage 3 changes, the temperature of air changes upon heat exchange with temperature-regulated air, and the air whose temperature has changed enters the optical path of the laser interferometer 106. Accordingly, the refractive index of air in the optical path changes (fluctuates), which causes a measurement error. For this reason, heat generated by the driving mechanism should be removed quickly.

To remove heat generated by the driving mechanism 105 which drives the wafer stage 10, and keep the temperature constant, a cooling pipe 5 can be arranged around the heat generating portion including a linear motor assembled in the driving mechanism 105, and a driver for driving it. A temperature-regulated cooling medium (medium) 30 is circulated through the cooling pipe 5. The cooling medium 30 is temporarily stored in a tank 29, and is supplied to the driving mechanism 105 via a pipe line 32. The cooling medium 30 in the tank 29 is pumped by a pump 31 and supplied to a heat exchanger (primary temperature regulator) 24. The heat exchanger 24 is, for example, a plate type heat exchanger, and causes heat exchange between the cooling medium 30 and cooling water 27 by making them flow as counter flows via the plate. A temperature sensor 22a measures the temperature of the cooling medium 30 having passed through the heat exchanger 24, and provides the result to a first unit 21 of a temperature controller 20. The first unit 21 controls the temperature by regulating the opening of a control valve 23 to keep the measurement value of the temperature sensor 22a constant, and regulating the flow rate of the cooling water 27 flowing through the heat exchanger 24. The cooling water 27 is supplied from, for example, plant facilities via a pipe line 25. The temperature regulation method using heat exchange between the cooling water 27 and the cooling medium 30 has been described. However, for example, a temperature regulation method using a hot gas bypass type cooler capable of changing the cooling capacity is also available.

The cooling medium 30 whose temperature has been regulated by the heat exchanger 24 passes along the pipe line 32 through a heater (secondary temperature regulator) 28 arranged near the driving mechanism 105 of the wafer stage 10, and is supplied to the driving mechanism 105. The wafer stage 10 has a temperature sensor 22b. A temperature measured by the temperature sensor 22b is provided to a second unit 26 of the temperature controller 20. The second unit 26 operates the heater 28 so that a temperature measured by the temperature sensor 22b reaches a target temperature, and regulates the temperature of the cooling medium 30 passing through the heater 28. The cooling medium 30 passes through the cooling pipe 5 assembled in the driving mechanism 105, recovering heat generated by a heat generating source such as the linear motor. As a result, the temperature of the driving mechanism 105, and further that of the wafer stage 10 are regulated to target temperatures.

The stage controller 13 operates the driving mechanism 105 in accordance with the driving pattern, and the amount of heat generated by the driving mechanism 105 depends on the driving pattern. In a conventional temperature control method, the target temperature of temperature regulation by the first unit 21 (heat exchanger 24) is set low enough to be able to control the temperature even for a driving pattern which maximizes the amount of generated heat. That is, the target temperature of temperature regulation by the first unit 21 (heat exchanger 24) is conventionally set to a temperature at which the manipulated variable of the heater (secondary temperature regulator) 28 is not saturated at a lower limit, or the saturation time is suppressed short even for a driving pattern which maximizes the amount of generated heat. In this conventional method, the heater 28 always warms up the cooling medium 30 which is regulated to a low target temperature determined in consideration of the maximum amount of generated heat. Hence, excessive electric power is consumed when the availability of the device manufacturing apparatus is low or when the device manufacturing apparatus operates in accordance with a driving pattern with which the amount of generated heat is small.

To prevent this, when the productivity of the device manufacturing apparatus 100 is low, the device manufacturing apparatus 100 is preferably set in the electric power saving mode via the console 102 and/or 120. In this example, the target temperature of temperature regulation by the first unit 21 can be changed to be higher than that in the non-electric power saving mode in order to suppress the above-mentioned excessive electric power consumption. This reduces electric power consumed by the heater (secondary temperature regulator) 28.

Figure 7A:
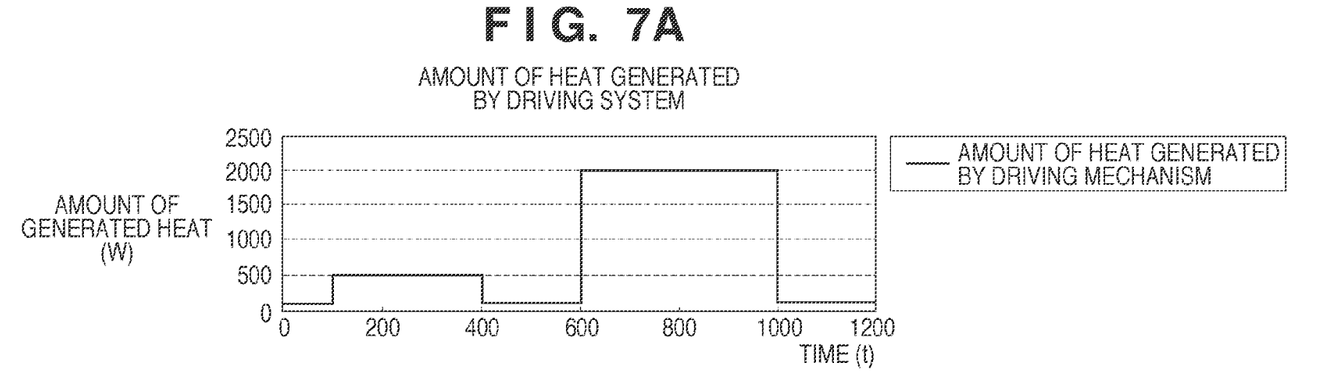
FIGS. 7A to 7D are graphs exemplifying temperature control when the maximum amount of generated heat is assumed as the amount of heat generated by a wafer stage driving mechanism.

FIGS. 7A to 7D exemplify temperature control when the maximum amount of generated heat is assumed as the amount of heat generated by the driving mechanism 105 of the wafer stage 10. FIG. 7A exemplifies the amount of heat generated by the driving mechanism 105 of the wafer stage 10. The ordinate axis indicates the amount of generated heat (W), and the abscissa axis indicates the time (no unit). The smallest amount of generated heat corresponds to a standby state. The driving pattern in the time period of 100 to 400 is one with which the amount of generated heat is small, such as lowacceleration driving. The driving pattern in the time period of 600 to 1000 is one which maximizes the amount of generated heat.

Figure 7B:
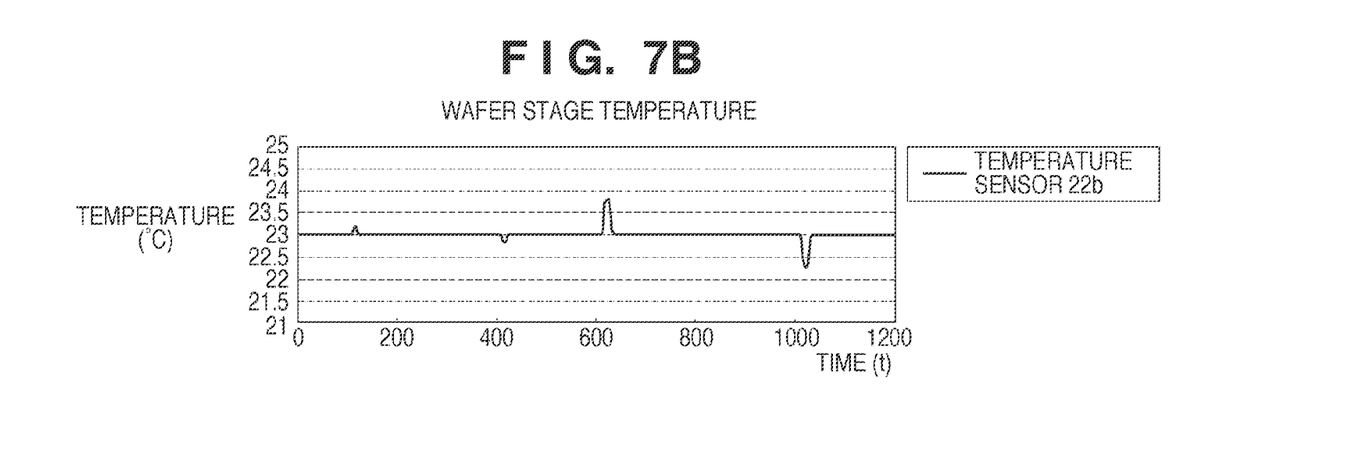
Figure 7C:
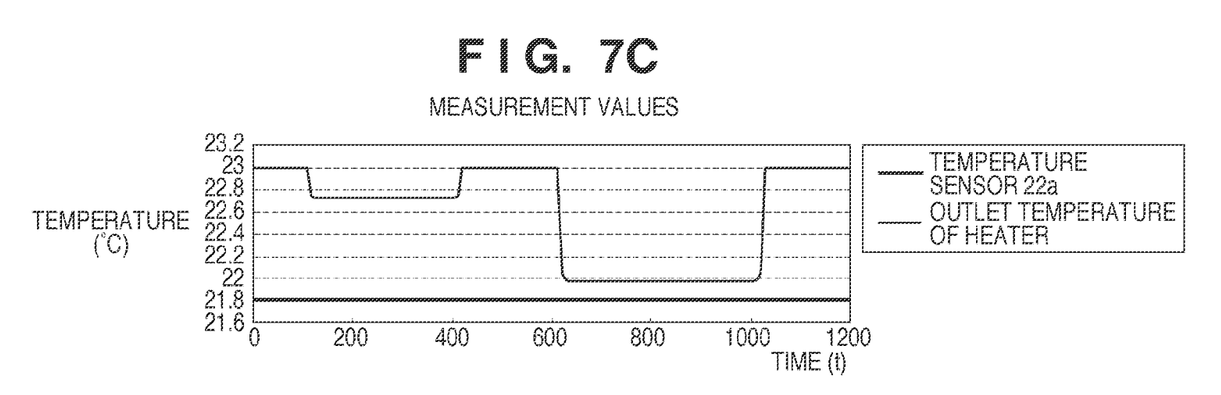
Figure 7D:
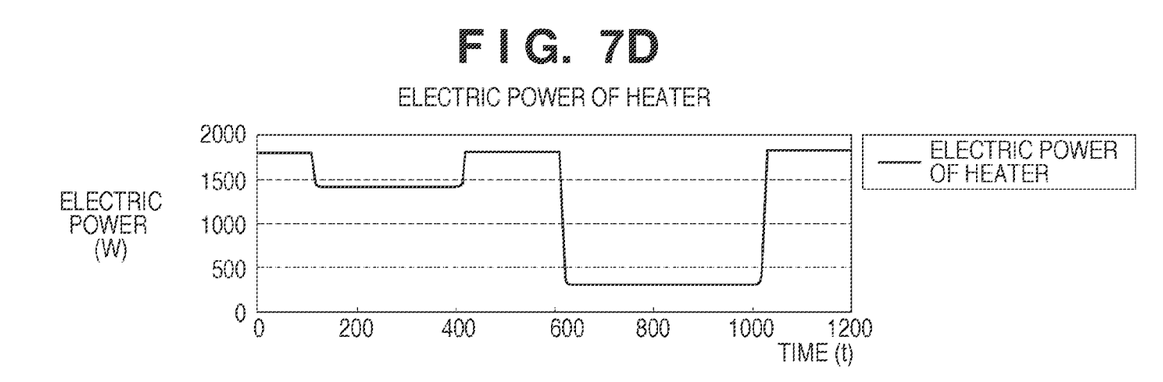

FIG. 7B exemplifies the measurement value of the temperature sensor 22b. The temperature varies at change points of the amount of heat generated by the driving mechanism 105. FIG. 7C exemplifies a temperature change of the cooling medium 30 in the non-electric power saving mode (steady state). The target temperature of temperature control by the first unit 21 is set to 21.8° C. The outlet temperature of the heater 28 that is controlled by the second unit 26 is maintained to be higher than the target temperature of temperature control by the first unit 21 even when the driving mechanism 105 generates a maximum amount of heat. With this setting, the temperature of the cooling medium can be controlled without saturating a manipulated variable output from the second unit 26 to the heater 28 at a lower limit. FIG. 7D exemplifies electric power consumed by the heater 28. In contrast to FIG. 7A, the heater 28 consumes a larger amount of electric power as the amount of heat generated by the driving mechanism 105 is smaller.

In the electric power saving mode, the target temperature of temperature control by the first unit 21 that is exemplified in FIG. 7C can be raised from 21.8° C. to, for example, 22.6° C. Electric power consumption of the heater 28 can be suppressed by setting the target temperature of temperature control by the first unit 21 to be close to that of temperature control by the second unit 26. Instead, the target temperature of temperature control by the first unit 21 may be set equal to that of temperature control by the second unit 26. It is also effective to switch to cascade control using a temperature control system including the second unit 26 as a major loop, and a temperature control system including the first unit 21 as a minor loop.

A method of manufacturing a device (e.g., a semiconductor device or liquid crystal display device) according to an embodiment of the present invention will be explained. This method can adopt, as an exposure apparatus, the device manufacturing apparatus to which the present invention is applied.

A semiconductor device is manufactured through a pre-process of forming an integrated circuit on a wafer (semiconductor substrate), and a post-process of completing, as a product, the integrated circuit chip on the wafer that has been formed in the pre-process. The pre-process can include a step of exposing a wafer coated with a photoresist using the exposure apparatus, and a step of developing the wafer exposed in the preceding step. The post-process can include an assembly step (dicing and bonding), and a packaging step (encapsulation). A liquid crystal display device is manufactured through a process of forming a transparent electrode. The process of forming a transparent electrode can include a step of applying a photoresist to a glass substrate on which a transparent conductive film is formed by vapor deposition, a step of exposing the glass substrate coated with the photoresist using the exposure apparatus, and a step of developing the glass substrate exposed in the preceding step.

The device manufacturing method in the embodiment is more advantageous than a conventional one in terms of at least one of the device performance, productivity, quality, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-209810, filed Sep. 10, 2009, which is hereby incorporated by reference herein in its entirety.

What is claimed is:

1. An apparatus for manufacturing a device, comprising:
a plurality of temperature regulators each of which is configured to regulate a temperature of a component associated with manufacture of the device;
a controller configured to control the plurality of temperature regulators; and
a console configured to send command information to the controller upon receiving an input regarding start of an electric power saving mode of the plurality of temperature regulators, the command information including a parameter which specifies one of a plurality of electric power saving mode settings each of which is set in advance for the plurality of temperature regulators, and a command for causing the plurality of temperature regulators to operate in one of the plurality of electric power saving mode settings, which is selected by the parameter, the console being configured to provide a user interface to determine the parameter in accordance with input from the user interface, the console being configured such that the plurality of electric power saving mode settings are set, in accordance with input from the user interface, to be different from each other in at least one of i) a temperature regulator, to be shifted to an electric power saving state, of the plurality of temperature regulators, ii) whether temperature regulation by a temperature regulator, to be shifted to an electric power saving state, of the plurality of temperature regulators stops, and iii) whether a target temperature of temperature regulation by a temperature regulator, to be shifted to an electric power saving state, of the plurality of temperature regulators is changed.

2. An apparatus according to claim 1, wherein
the plurality of temperature regulators includes temperature regulators including a primary temperature regulator configured to regulate a temperature of a cooling medium, and a secondary temperature regulator configured to regulate a temperature of the cooling medium whose temperature has been regulated by the primary temperature regulator, and
the command information includes a parameter which indicates, as the target temperature, a target temperature of temperature regulation by the primary temperature regulator in the electric power saving mode closer to a target temperature of temperature regulation by the secondary temperature regulator in a non-electric power saving mode than to a target temperature of temperature regulation by the primary temperature regulator in the non-electric power saving mode.

3. An apparatus according to claim 2, wherein the primary temperature regulator includes a heat exchanger, and the secondary temperature regulator includes a heater.

4. An apparatus according to claim 1, wherein the device manufacturing apparatus is configured as an exposure apparatus for exposing a substrate to radiant energy.

5. An apparatus according to claim 1, wherein the command information includes a parameter which indicates the target temperature.

6. An apparatus according to claim 1, wherein the command information includes a parameter which indicates a temperature regulator temperature regulation by which is stopped.

7. An apparatus according to claim 1, wherein the console is configured to select one of a plurality of electric power saving modes, with respect to each of the plurality of temperature regulators, in accordance with input from the user interface so as to set in advance each of the plurality of electric power saving mode settings.

8. An apparatus for manufacturing a device, comprising:
a plurality of temperature regulators each of which is configured to regulate a temperature of a component associated with manufacture of the device;
a controller configured to control the plurality of temperature regulators; and
a console configured to send command information to the controller upon receiving an input regarding start of an electric power saving mode of the plurality of temperature regulators, the command information including a parameter which specifies one of a plurality of electric power saving mode settings each of which is set in advance for the plurality of temperature regulators, and a command for causing the plurality of temperature regulators to operate in one of the plurality of electric power saving mode settings, which is selected by the parameter, the console being configured to provide a user interface to determine the parameter in accordance with input from the user interface, the console being configured such that the plurality of electric power saving mode settings are set, in accordance with input from the user interface, to be different from each other in whether a target temperature of temperature regulation by a temperature regulator, to be shifted to an electric power saving state, of the plurality of temperature regulators is changed.

* * * * *